(12) United States Patent
Schmidhammer

(10) Patent No.: US 8,766,741 B2
(45) Date of Patent: Jul. 1, 2014

(54) CIRCUIT COMPRISING A VOLTAGE-DEPENDENT COMPONENT AND METHOD FOR OPERATING THE CIRCUIT

(75) Inventor: Edgar Schmidhammer, Stein an der Traun (DE)

(73) Assignee: Qualcomm Technologies, Inc., San Diego, CA (US)

( * ) Notice: Subject to any disclaimer, the term of this patent is extended or adjusted under 35 U.S.C. 154(b) by 770 days.

(21) Appl. No.: 12/687,559

(22) Filed: Jan. 14, 2010

(65) Prior Publication Data

US 2010/0176895 A1 Jul. 15, 2010

(30) Foreign Application Priority Data

Jan. 15, 2009 (DE) .......... 10 2009 004 721

(51) Int. Cl.
*H03H 7/38* (2006.01)
*H01G 7/06* (2006.01)

(52) U.S. Cl.
USPC ................ 333/32; 333/17.3; 361/277

(58) Field of Classification Search
USPC ............ 333/124, 17.3, 32; 361/271, 277, 281
See application file for complete search history.

(56) References Cited

U.S. PATENT DOCUMENTS

| | | | |
|---|---|---|---|
| 2,555,959 A | | 6/1951 | Curtis |
| 6,992,543 B2 * | | 1/2006 | Luetzelschwab et al. ...... 333/32 |
| 7,109,818 B2 * | | 9/2006 | Rivkina et al. .............. 333/24 C |
| 8,072,285 B2 * | | 12/2011 | Spears et al. ................. 333/17.3 |
| 8,164,271 B2 * | | 4/2012 | Yang ............................. 315/283 |
| 8,174,341 B2 * | | 5/2012 | Lee et al. ...................... 333/219 |
| 8,217,731 B2 * | | 7/2012 | Mckinzie, III ............... 333/17.3 |
| 2009/0153431 A1 * | | 6/2009 | Ni ................................. 343/861 |

FOREIGN PATENT DOCUMENTS

| | | |
|---|---|---|
| GB | 829566 | 3/1960 |
| GB | 1090037 | 11/1967 |

OTHER PUBLICATIONS

Pervez N.K. et al "Optimization of High Tenability Barium Strontium Titanate Thin Films Grown by RG Magnetron Sputtering" IEEE, dated Aug. 23-27, 2004; (3 pages).
Scott J. F. et al Infrared Spectra and Second-Harmonic Generation in Barium Strontium Titanate and Lead Zirconate-Titanate Thin Films. "Polaron Artifacts" Journal of Applied Physics, vol. 94, No. 5,01, dated Sep. 2003, pp. 3333-3344 (12 pages).
Sematech "Semiconductor Device Reliability Failure Models" dated May 31, 2000 (34 pages).

(Continued)

*Primary Examiner* — Dean O Takaoka
*Assistant Examiner* — Alan Wong
(74) *Attorney, Agent, or Firm* — Smith Risley Tempel Santos LLC

(57) ABSTRACT

A circuit is proposed by means of which a ceramic component having two electrodes can be provided with a uniform, but periodically alternating BIAS voltage. The component has properties dependent on the level of the BIAS voltage and, for the purpose of an increased service life, is connected to a generator for generating a BIAS voltage and to means for periodically reversing the polarity of the BIAS voltage present at the electrodes. In a method for operating the component having variable properties, a uniform BIAS voltage, the polarity of which is periodically reversed, however, is applied to the electrodes, and the service life of the component is thus increased.

10 Claims, 3 Drawing Sheets

(56) References Cited

OTHER PUBLICATIONS

Yamamichi S. et al. "Impact of the Time Dependent Dielectric Breakdown and Stress-Induced Leakage Current on the Reliability of High Dielectric Constant (Ba, Sr)TiO$_3$ Thin-Film Capacitors for Gbit-Scale DRAM's" IEEE Transactions on Electron Devices, vol. 46, No. 2, dated Feb. 1999, pp. 342-347 (6 pages).

Zafar S. et al. "Oxygen Vacancy Mobility Determined from Current Measurements in Thin Ba$_{0.5}$Sr$_{0.5}$Tio$_3$ Films" Applied Physics Letters, vol. 73, No. 2, 13, dated 1998, pp. 175-177 (3 pp.).

* cited by examiner

CIRCUIT COMPRISING A VOLTAGE-DEPENDENT COMPONENT AND METHOD FOR OPERATING THE CIRCUIT

CROSS-REFERENCE TO RELATED APPLICATION

This application claims the benefit under 35 U.S.C. §119 of Germany Patent Application Serial No. 10 2009 004 721.2, filed in Germany on Jan. 15, 2009, entitled "Circuit Comprising A Voltage-Dependent Component And Method for Operating The Circuit."

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND

Junction capacitors can be produced with doped ferroelectric ceramics as dielectric. Although capacitors composed of said ceramics have a high capacitance, they also have a highly nonlinear dependence of the capacitance on the temperature and on the voltage present. The change in capacitance can be up to 80% in the case of some materials or rated voltage values. This is exploited in capacitors having capacitance values dependent on a BIAS voltage. In particular, it is thus possible to produce variable voltage-controlled matching circuits such as are required, e.g., in radio frequency (RF) technology.

Known dielectrics composed of ferroelectric materials are, e.g., barium titanate and strontium titanate with suitable additives. Capacitors composed thereof alter their dielectric constant with the size of the voltage present.

However, the ageing of these components is disadvantageous. The electrical values of the ceramic capacitors in these components, in particular the capacitance value thereof, change with time.

The ageing and hence the service life of these components are in this case greatly dependent on parameters such as present field strength, temperature, and proportion of oxygen vacancies in the material. Since the service life is an essential criterion for the usability of these components in RF circuits and in particular in the RF part of mobile telephones, it is necessary to find components and methods with which the hitherto unsatisfactory service life of these components can be increased.

BRIEF SUMMARY

It is an object of the present invention, therefore, to specify circuits comprising ceramic components composed of said ageing-susceptible materials, in particular, which are improved with regard to the expected service life.

This object is achieved according to the invention by means of a circuit according to claim 1. A method for operating the circuit and advantageous configurations of the invention can be gathered from further claims.

The inventors have found that ceramic components, that is to say components having a ceramic functional layer, behave similarly to PIN diodes under an applied BIAS voltage. Accordingly, a leakage current also flows under applied voltage. It has additionally been found that the proportion of oxygen in the ceramic is crucial for the properties of the ceramic component and in particular for the ageing thereof. This is because it has also been ascertained that oxygen vacancies in the ceramic microstructure can produce a leakage current. The latter can admittedly be influenced by doping, but not prevented.

As a cause of the ageing process it has been recognized that ions slowly accumulate in the insulation zone of the ceramic functional layer—that is to say in the zone between the two electrodes of the ceramic component—under applied BIAS voltage in the vicinity of the electrode. As a result, the width of the insulation zone slowly decreases. Starting from a specific point in time, a short circuit then occurs, in the case of which the component "blows," which becomes apparent in a steep rise in the leakage current.

The shrinking of the insulation zone is attributed to the migration of the oxygen vacancies, on account of which the ceramic functional layer slowly becomes polarized. A positively charged region thus remains in the vicinity of the anode, said region corresponding to the missing oxygen atoms, that is to say the vacancies. A negatively charged region is produced in the region of the cathode, since excess oxygen ions accumulate there. As the charged zones become larger and larger over time, at some point a short circuit occurs, which irrevocably destroys known components.

The invention now proposes counteracting this ion migration in the ceramic functional layer and thus in the ceramic component by periodically reversing the polarity of the BIAS voltage present.

This is because it has been found that the electrical properties remain unchanged even upon reversal of the polarity of the BIAS voltage and are therefore dependent only on the magnitude, but not on the polarity of the BIAS voltage. Periodic polarity reversal prevents the ceramic functional layer from becoming polarized since ion migration under a first polarity can be compensated for by corresponding ion migration in the opposite direction after polarity reversal. In the case of a circuit according to the invention, this has the effect that this failure mechanism is virtually completely compensated for and the service life of the ceramic components in the circuit is significantly increased. With a service life increased in such a way, it is also possible to use these components in circuits which require a high reliability and a long service life.

The invention specifies a circuit comprising a ceramic component having two electrodes. Electrical properties of the component are set by means of a BIAS voltage present at said electrodes. The circuit furthermore comprises a generator for generating the BIAS voltage, and means which can be used to perform periodic reversal of the polarity of the BIAS voltage present at the electrodes. The generator is designed, in particular, for generating a variable BIAS voltage.

For reversing the polarity of the BIAS voltage, it is possible to use a generator which can be used to generate a rectangular voltage that is symmetrical about the zero line with a periodic change in the polarity. Rectangular DC voltage is understood to mean a voltage profile which remains at the desired rated voltage for as long as possible and then rapidly changes polarity, a voltage being obtained which is identical in terms of magnitude but exactly opposite in terms of sign. What is crucial for the quality of the component is the speed of the polarity reversal and hence the gradient of the rectangular-waveform DC voltage. The desired rated voltage is then present at the component in constant fashion for a maximum time duration, such that the properties dependent on the BIAS voltage can remain constant over a maximum period of time. It is only in this way that a stable circuit or a circuit having stable properties is obtained.

A rapid periodic reversal of the polarity of the BIAS voltage is accomplished by means of a generator designed for generating a DC voltage. With the aid of switching means, the DC voltage generated by the generator can then be applied alternately to the two electrodes. The proportion of time in which the component or the circuit can be operated at rated voltage rises with the switching speed in this case. A rapid rise in the BIAS voltage to the rated value is also accomplished with the aid of suitable switching means.

The switching means provided can be, in particular, semiconductor switches, for example semiconductor circuits based on gallium arsenide, which, designed using heterojunction bipolar technology, can switch the switch over particularly rapidly. It is also possible to use silicon-based semiconductor switches, for example silicon diodes, as switching means. Electromechanical switches, for example MEMS components (MEMS=Micro-Electro-Mechanical System), are furthermore possible.

In one configuration, the circuit can furthermore comprise an RF circuit, in which the component is connected to an RF signal source. BIAS voltage-dependent control of the ceramic component and thus of the circuit is accomplished if the BIAS voltage is superposed on the RF signal and the BIAS voltage interval that can be utilized for control, that is to say the maximum voltage range of DC voltage present in which a change in the properties is achieved, is significantly larger than the RF voltage present.

A ceramic component having a functional layer, the material of which comprises an oxide, is particularly advantageously used in the circuit according to the invention. Oxides can generally be formed in a non-stoichiometric composition, such that defects are formed in the oxide lattice, which produce the leakage current already mentioned initially, which in turn, as recognized by the inventors, leads to the ageing or blowing of the ceramic component.

In one preferred embodiment, the ceramic component in the circuit according to the invention is used as a voltage-dependent capacitance. In this case, the properties of the circuit can be set in a variable manner by means of the level of the applied BIAS voltage and thus by means of the capacitance value of the component that is achieved. A circuit having a capability for matching is thus obtained. For this purpose, it is possible to use a generator designed for generating a variable DC voltage having a symmetrical rectangular profile.

A varactor, also called variocap or variable-capacitance diode, can also be used as a component in the circuit according to the invention. This is a semiconductor component having a capacitance that is dependent on a BIAS voltage present. The variable-capacitance diode is used for tuning resonant circuits in filters and oscillator circuits, for example instead of variable capacitors or variable inductances for tuning in radio receivers (e.g. radios, television receivers).

Variable-capacitance diodes connected to LC resonant circuits in addition are used for automatic fine tuning (AFC) in receivers or for frequency modulation in FM transmitters.

Known ceramic components having a ceramic functional layer composed of BST (barium strontium titanate), in which the cations barium and strontium can occur in any desired mixing ratio, have a high sensitivity toward ageing. A circuit comprising a ceramic component having a functional layer composed of the BST system is particularly advantageously stabilized with respect to said ageing process with the BIAS voltage periodically subjected to polarity reversal according to the invention.

In a further configuration, the circuit is designed as an adaptive impedance matching circuit. In this case, it is used for matching a signal source to the impedance of a load. In this case, the variability of the matching circuit is achieved by means of a ceramic component having a variable capacitance, the capacitance of which is dependent on the BIAS voltage present. Therefore, the properties of the impedance matching circuit and thus the quality of the impedance matching can also be set by means of the generator designed for generating a variable BIAS voltage.

In one advantageous configuration, an impedance matching circuit comprises at least two adaptive components, the properties of which are set independently of one another by means of a BIAS voltage respectively applied to the electrodes of the adaptive components. Maximum regulability of the impedance matching circuit is obtained if one of the adaptive components is arranged in a serial branch of the circuit and one of the adaptive components is arranged in a parallel branch of the circuit.

The variation range of the matching circuit is maximal if both adaptive components can be supplied with BIAS voltages that can be set independently. Accordingly, one generator for independently generating two BIAS voltages is required, or two generators that can be operated independently of one another are required.

A circuit comprising a ceramic component comprising two electrodes to which is applied a BIAS voltage for setting the properties of the ceramic component can be operated virtually in a manner free of ageing if the polarity of the applied BIAS voltage is periodically changed. Particularly advantageously, the method for operating the circuit is carried out with a DC BIAS voltage having a rectangular profile.

During the operation of the circuit, the component can be connected to an RF signal source. In this case, it is advantageous if the periodic polarity reversal of the BIAS voltage is effected with a selected frequency which does not produce any interfering intermodulation products with the RF signal. The generator for generating an alternating DC voltage having a rectangular profile is also advantageously designed in such a way that it likewise does not produce any frequencies which can produce interfering intermodulation products with the RF signal. This is advantageous particularly when the BIAS voltage having a rectangular-waveform profile is generated by superposition of different frequency components.

A variably matchable impedance matching circuit or an RF circuit which is used for the variable impedance matching of an RF signal source to a load comprises means which regularly or continuously determine the matching of the RF signal source to the load by measuring the power reflected from the load. The amount of reflected power is a measure of the mismatch. From the level of reflected power, the magnitude of the BIAS voltage to be applied is determined and generated by means of the generator. The period with which the polarity of the BIAS voltage is reversed advantageously remains constant, independently of the BIAS voltage present or the required rated magnitude of the BIAS voltage set in variable fashion.

One exemplary impedance matching problem for which the circuit according to the invention can advantageously be used is the matching of an RF transmitter to the environment-dependent impedance of an antenna. This problem occurs particularly in the front end of mobile radio devices in the case of which the user is in frequently changing proximity or relative position with respect to the antenna of the mobile radio device. In this case, the impedance of the antenna is greatly dependent on how the mobile radio device is held in the hand or the position in which the mobile radio device is situated with respect to the head.

A further application of the circuit is in the tuning of resonant circuits in filters and oscillator circuits. The circuit comprising varactors, for example, can be used instead of variable capacitors or variable inductances for tuning in radio receivers (e.g. in the case of radio or television receivers). With the circuit, these tunable resonant circuits can also be stabilized with respect to ageing.

The invention is explained in more detail below on the basis of exemplary embodiments and associated figures. The figures have been drawn up purely schematically and serve solely to illustrate the invention. They have not been drawn up to scale and individual parts may be shown in enlarged fashion in order to afford a better understanding. Therefore, no relative quantitative indications can be inferred from the figures either.

DETAILED DESCRIPTION

Figure 1:
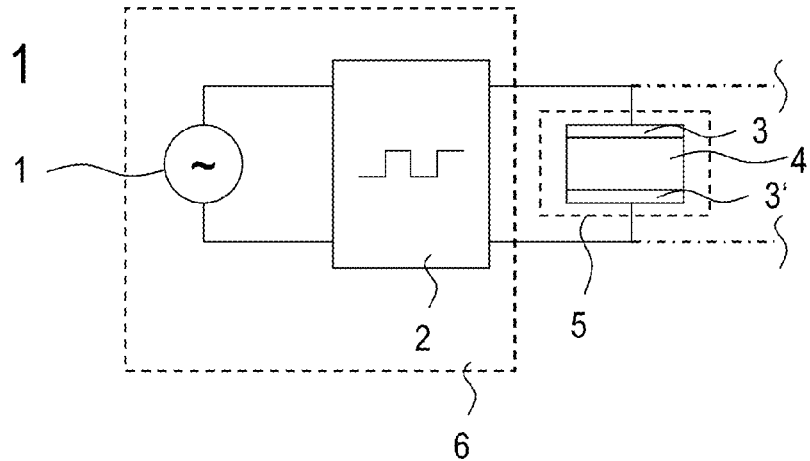
FIG. 1 shows an arrangement with the circuit according to the invention.

FIG. 1 shows in schematic illustration a simple circuit comprising a ceramic component 5, which has a dielectric 4 between two electrodes 3, 3'. At least one property of the ceramic component 5 changes depending on a BIAS voltage present at the electrodes 3, 3'. A device 6 for generating a periodically alternating BIAS voltage, in particular a rectangular voltage, ensures that at the electrodes 3, 3' of the ceramic component 5 a DC BIAS voltage having a desired level is always present, the polarity of which is reversed at periodic intervals. The device 6 can comprise a generator 1 for generating a DC BIAS voltage that can be set and switching means 2, which serve for periodically reversing the polarity of the DC voltage.

Figure 2A:
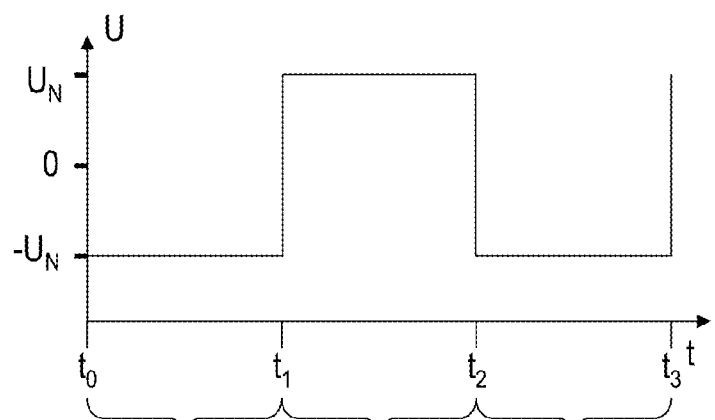
FIGS. 2A and 2B show an exemplary profile of the BIAS voltage and the movement of the charge carriers under the respectively applied voltage.

FIG. 2A shows an advantageous profile of the BIAS voltage. This profile is distinguished by its rectangular waveform. In the ideal case, the profile of the BIAS voltage alternately has sections of constant voltage, the polarity changing periodically and two voltages of opposite polarity but identical magnitude thus being present alternately. The transition between the corresponding positive and negative rated voltages $U_N$ and $-U_N$ is ideally vertical, but in reality is set to be as steep as possible.

Figure 2B:
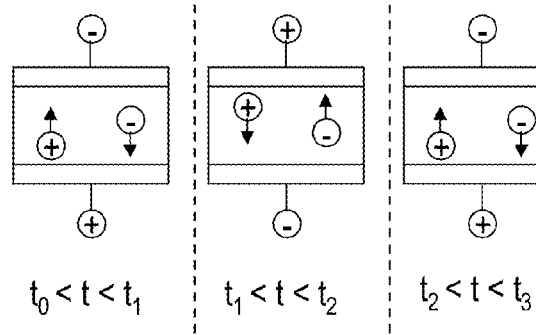

FIG. 2B shows, on the basis of schematic illustrations, the migration movements of charge carriers within the dielectric under the action of the applied BIAS voltage. In the first section of the voltage profile between the instants $t_0$ and $t_1$, a negative potential is present at the top electrode 3 of the ceramic component 5, whereas a positive potential is present at the bottom electrode 3'. A charge carrier migration caused, in particular, by the migration of positively charged oxygen defects leads to an accumulation of charge carriers in the region of the corresponding electrode of opposite polarity. Before this state is reached, however, the polarity of the voltage is reversed, with the result that the polarity of the electrodes 3, 3' changes. In the section between the instants $t_1$ and $t_2$, a positive potential is then present at the top electrode, whereas a negative potential is present at the bottom electrode 3'. This has the effect that the migration movements of the charge carriers from the first section then undergo transition to a migration movement in the opposite direction, with the result that in the ideal case the state as at the instant $t_0$ is re-established at the instant $t_2$. The voltage then changes over again at the instant $t_2$, with the result that a polarity relationship as in the first section is attained and the charge carriers migrate again in the opposite direction. In total, the BIAS voltage periodically subjected to polarity reversal prevents a charge carrier accumulation in the region of one or both electrodes which might otherwise lead to a reduction of the insulation region and ultimately to an electrical breakdown in the component.

Figure 4:
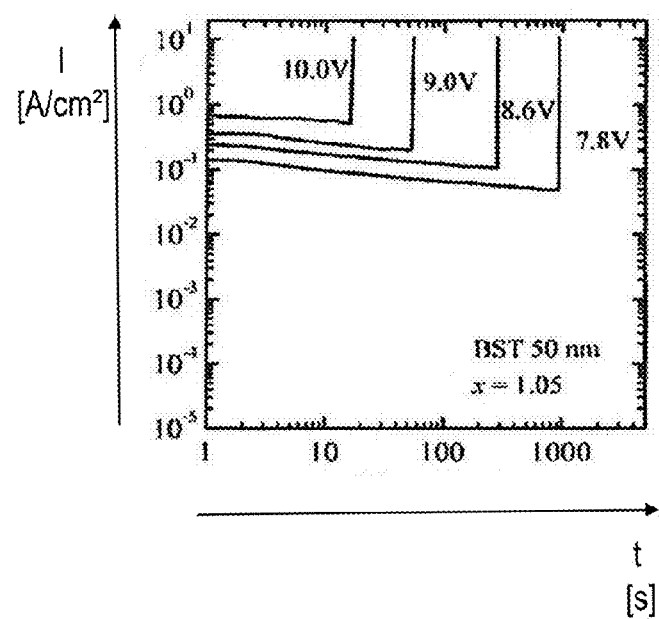
FIG. 4 shows the profile of the leakage current against time depending on various applied BIAS voltages.

FIG. 4 shows an exemplary leakage current profile of a known ceramic component 5 embodied as a capacitor without a circuit according to the invention under the action of BIAS voltages of different magnitudes. It becomes apparent from the illustration that the leakage current remains virtually constant over a certain period of time and falls only slightly before the component then abruptly suffers a breakdown that leads to a steep rise in the leakage current. The time duration until the occurrence of the breakdown increases as the BIAS voltage decreases.

A circuit according to the invention practically completely prevents an electrical breakdown of the component since, with the polarity reversal of the BIAS voltage, the effect that leads to the electrical breakdown is in each case compensated for respectively in sections. An accumulation of charge carriers in the vicinity of the electrodes and a shrinking of the insulation zone are thus avoided.

Figure 3:
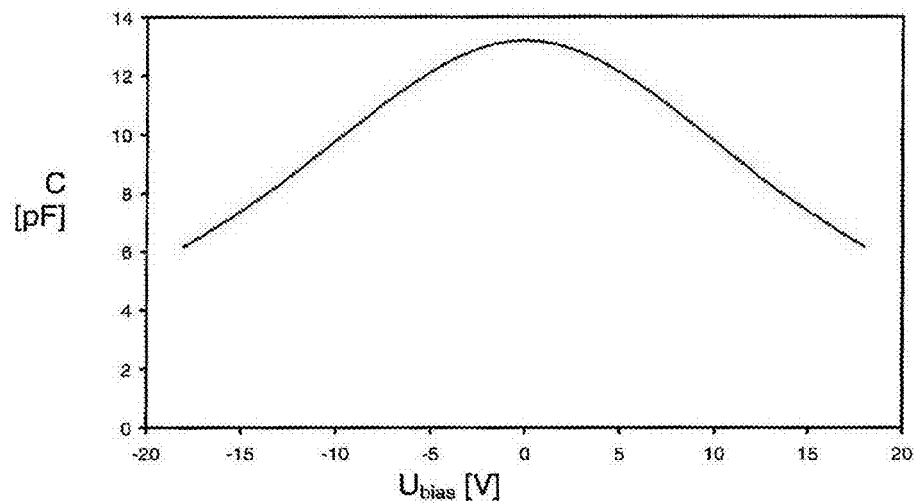
FIG. 3 shows the exemplary profile of the capacitance value of a capacitor as a function of the applied BIAS voltage.

FIG. 3 shows, on the basis of the example of a capacitor, a property dependent on the BIAS voltage present, here the capacitance value. The latter reaches its maximum value at a BIAS voltage of zero, that is to say when no BIAS voltage is present. The value of this parameter decreases as the BIAS voltage increases.

FIG. 3 reveals that this behavior is independent of the polarity of the voltage present, with the result that a curve that is symmetrical about the y-axis arises for the capacitance profile as a function of the voltage. It also becomes clear from this profile that the property dependent on the BIAS voltage is dependent exclusively on the magnitude of the BIAS voltage, with the result that an idealized BIAS voltage profile with periodically alternating polarity as illustrated in FIG. 2A corresponds with equivalent action to a constant BIAS voltage profile at $+U_N$ or $-U_N$. A BIAS voltage present as in FIG. 2A keeps constant the value that is dependent on the magnitude of the BIAS voltage.

In addition to the capacitors there also exist other components which, with a different physical parameter, have a behavior dependent on the BIAS voltage present. Many of these components can be improved in terms of their service life and long-term stability in conjunction with the circuit proposed.

Figure 5:
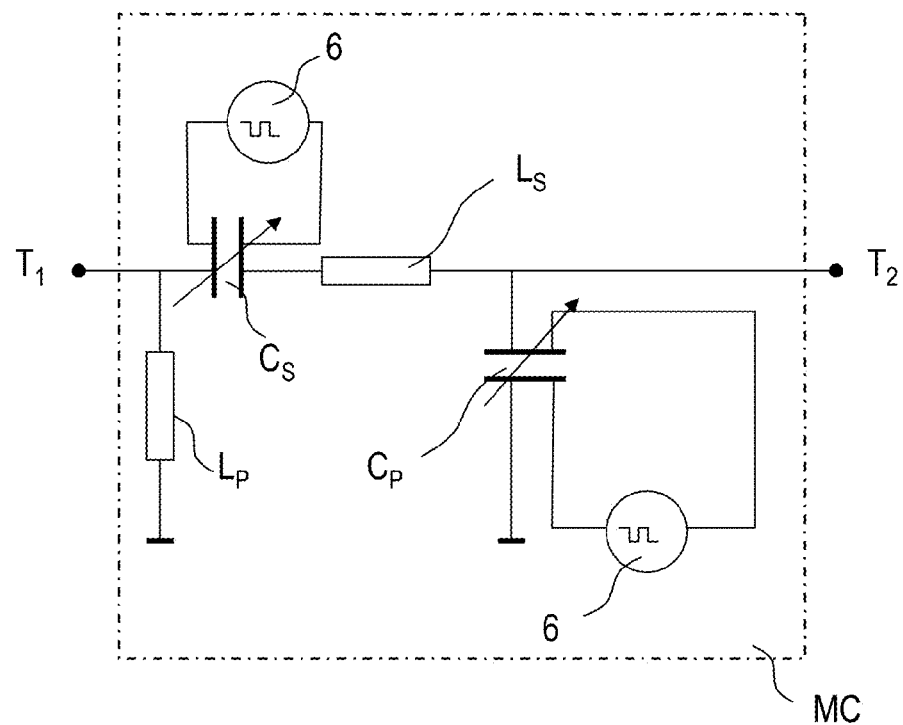
FIG. 5 shows an impedance matching circuit using the circuit according to the invention.

FIG. 5 shows an impedance matching circuit MC as an exemplary application of the circuit proposed. This circuit advantageously has at least two components whose properties can be set by means of the magnitude of the BIAS voltage present. At least one of these variable components is arranged in a serial branch that connects the two connection terminals $T_1$ and $T_2$, representing the input and output of the circuit. A further component Cp, here a variable capacitor, is arranged in a parallel branch with respect to ground.

In this circuit, a serial inductance $L_S$ and a further parallel branch with a parallel inductance $L_P$ arranged therein are provided as further impedance matching elements. Both variable components, in particular a serial capacitance $C_S$ and a parallel capacitance $C_P$, can be improved in terms of their stability and service life with the circuit according to the invention. By means of mutually independent setting of the BIAS voltage present at the variable components, impedance matching can be carried out by means of the impedance matching circuit MC proposed.

Figure 6:
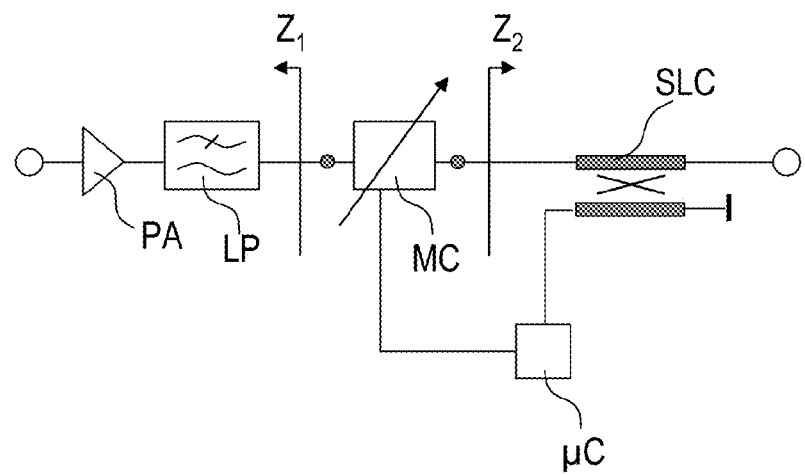
FIG. 6 shows an arrangement using the matching circuit from FIG. 5.

FIG. 6 shows a circuit arrangement using the impedance matching circuit MC described by way of example in FIG. 5. This circuit arrangement comprises a signal path that connects a first connection terminal $T_1$ to a second connection terminal $T_2$. A signal applied to the connection terminal $T_1$ is conducted via a power amplifier PA and a low-pass filter LPF and has an output impedance $Z_1$, for example, downstream of the low-pass filter. In order to connect said output impedance to a load connected to the second connection terminal $T_2$, in particular an antenna, it is necessary to bring the output impedance $Z_1$ to the input impedance of the load or antenna with the aid of a matching circuit. A matching circuit MC embodied according to the invention can be used for this purpose, and makes it possible to match the impedance $Z_1$ to an impedance $Z_2$ with the aid of suitable BIAS voltages applied to the variable components (capacitors). Within a changing output impedance at the connection terminal $T_2$, the matching can be readjusted by corresponding setting of the BIAS voltage applied to the variable component.

A directional coupler SLC consisting of two coupled line sections, for example, is arranged between the matching circuit and the second connection terminal $T_2$. The directional coupler is used to determine the power which is reflected back via the second connection terminal $T_2$ and which represents a measure of a mismatch of the impedance. With the aid of a microcontroller μC, for example, the components of the impedance matching circuit MC that are variable in terms of their properties are acted on and altered matching is thus brought about until the power which is reflected at the second connection terminal $T_2$ and is detected by the directional coupler SLC falls below a desired minimum level. The minimum level is chosen in accordance with desired or optimum matching and then set with the aid of the microcontroller μC, for example.

The invention is not restricted to the circuits and circuit arrangements illustrated in the exemplary embodiments and figures. Rather, it is possible for a circuit which has a component that is variable in terms of its properties to be operated with the aid of a rectangular-waveform BIAS voltage and to be used in any other applications and to be incorporated in any other circuit arrangements. In all cases, the rectangular-waveform BIAS voltage applied according to the invention guarantees an increased stability and service life of the component, by which the function of a circuit comprising the component is kept stable and constant over a longer operating period than that known heretofore.

LIST OF REFERENCE SYMBOLS

1 Generator for BIAS voltage
2 Means for periodic polarity reversal
3, 3' First and second electrodes
4 Dielectric/functional layer
5 Component
6 Generator for periodic BIAS voltage
$T_1$; $T_2$ Connection terminal
$L_P$ Parallel inductance
$L_S$ Serial inductance
$C_P$ Parallel capacitance
$C_S$ Serial capacitance
MC Matching circuit
μC Microcontroller
LPF Low-pass filter
PA Power amplifier
SLC Directional coupler
Z1, Z2 Impedance

What is claimed is:

1. A circuit, comprising:
 a generator for generating a DC BIAS voltage whose magnitude is variable by the generator, the generator including switching means for periodically alternating a polarity of the DC BIAS voltage such that the generator produces an alternating DC voltage;
 a ceramic component having two electrodes, the properties of which component are set by the alternating DC voltage applied to the electrodes;
 wherein the circuit is an adaptive impedance matching circuit for matching a signal source to a load,
 wherein the ceramic component has a variable capacitance dependent on the alternating DC voltage applied to the electrodes,
 wherein the impedance matching is effected via the alternating DC voltage,
 wherein the ceramic component is connected to an RF signal source, the alternating DC voltage being superposed on the RF signal,
 wherein the generator is configured so as not to produce any frequencies that produce interfering intermodulation products with the RF signal, and
 wherein a maximum voltage range of DC voltage present in the alternating DC voltage is significantly larger than the RF voltage present in the RF signal.

2. The circuit as claimed in claim 1, wherein the ceramic component has a functional layer, the material of which comprises an oxide.

3. The circuit as claimed in claim 2, wherein the ceramic component is a varactor or a variable-capacitance diode.

4. The circuit as claimed in claim 2, wherein the material includes barium-strontium-titanate.

5. The circuit as claimed in claim 1,
 wherein the circuit comprises at least two adaptive components ($C_S$, $C_P$), the properties of which are set independently of one another by a respective BIAS voltage of the alternating DC voltage applied in each case to corresponding electrodes of the at least two adaptive components,
 wherein one of the adaptive components is arranged in a serial branch of the circuit and another of the adaptive components is arranged in a parallel branch of the circuit, and
 wherein the generator is operable to generate independently the respective BIAS voltages applied to corresponding electrodes of the at least two adaptive components, wherein the respective BIAS voltages can be set independently of one another.

6. The circuit of claim 1, wherein the circuit is used for matching an RF transmitter to the environment-dependent impedance of an antenna.

7. The circuit of claim 6, wherein the circuit is used in the front end of a terminal for mobile communication.

8. A method for operating a circuit comprising a ceramic component having two electrodes, the properties of which component are set by a variable DC BIAS voltage applied to the electrodes, the method comprising:
produce a DC BIAS voltage having a variable magnitude;
periodically changing the polarity of the DC BIAS voltage to produce an alternating DC voltage that is rectangular and changes periodically in its polarity, wherein the ceramic component is connected to an RF signal source;
selecting a frequency that does not produce any interfering intermodulation products with the RF signal to effect the polarity reversal of the DC BIAS voltage;
superposing the alternating DC voltage on the RF signal, wherein a maximum voltage range of DC voltage present in the alternating DC voltage is significantly larger than the RF voltage present in the RF signal,
wherein the circuit is an RF circuit used for the variable impedance matching of the RF signal source to a load;
the circuit regularly or continuously determines the matching of the RF signal source to the load by measuring the power reflected by the load; and
setting the magnitude of the DC BIAS voltage respectively present in a manner dependent on the power respectively reflected at a point in time.

9. The method of claim 8 wherein the circuit is used for matching an RF transmitter to the environment-dependent impedance of an antenna.

10. The method of claim 9, wherein the circuit is used in the front end of a terminal for mobile communication.

* * * * *